(12) United States Patent
Arimitsu et al.

(10) Patent No.: US 7,635,516 B2
(45) Date of Patent: Dec. 22, 2009

(54) HEAT-PEELABLE PRESSURE-SENSITIVE ADHESIVE SHEET AND METHOD FOR PROCESSING ADHEREND USING THE HEAT-PEELABLE PRESSURE-SENSITIVE ADHESIVE SHEET

(75) Inventors: Yukio Arimitsu, Ibaraki (JP); Daisuke Shimokawa, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 560 days.

(21) Appl. No.: 10/591,940

(22) PCT Filed: Feb. 18, 2005

(86) PCT No.: PCT/JP2005/003069

§ 371 (c)(1),
(2), (4) Date: Sep. 8, 2006

(87) PCT Pub. No.: WO2005/087888

PCT Pub. Date: Sep. 22, 2005

(65) Prior Publication Data

US 2008/0160293 A1 Jul. 3, 2008

(30) Foreign Application Priority Data

Mar. 11, 2004 (JP) .............................. 2004-068770

(51) Int. Cl.
- *B32B 7/12* (2006.01)
- *B32B 15/04* (2006.01)
- *C08J 9/16* (2006.01)
- *H01L 21/00* (2006.01)

(52) U.S. Cl. .................... 428/343; 428/317.5; 428/346; 428/354; 521/56; 438/464

(58) Field of Classification Search ................ 428/200, 428/317.5, 343, 346, 354; 521/56, 58; 438/464
See application file for complete search history.

(56) References Cited

U.S. PATENT DOCUMENTS

2004/0003883 A1   1/2004   Kiuchi et al.

FOREIGN PATENT DOCUMENTS

| EP | 1 328 601 B1 | 7/2003 |
|---|---|---|
| JP | 50-13878 | 5/1975 |
| JP | 51-24534 | 7/1976 |

(Continued)

*Primary Examiner*—Patricia L Nordmeyer
(74) *Attorney, Agent, or Firm*—Birch, Stewart, Kolasch & Birch, LLP

(57) ABSTRACT

Disclosed is a heat-peelable pressure-sensitive adhesive sheet that can prevent the deformation of a pressure-sensitive adhesive layer caused by pressurization, further reduce chipping in grinding and cutting processes, be easily peeled off from a processed article after processing, and can be easily applied to an adhered at ordinary temperature. The heat-peelable pressure-sensitive adhesive sheet includes a substrate, and a heat-expandable pressure-sensitive adhesive layer arranged on or above at least one side of the substrate, the heat-expandable pressure-sensitive adhesive layer containing a foaming agent and having a shear modulus (23° C.) in an unfoamed state of $7 \times 10^6$ Pa or more. The adhesive sheet further includes a pressure-sensitive adhesive layer being arranged on or above heat-expandable pressure-sensitive adhesive layer, wherein the pressure-sensitive adhesive layer has a shear modulus (23° C.) of less than $7 \times 10^6$ Pa and a thickness of 0.01 to 10 μm.

11 Claims, 1 Drawing Sheet

FOREIGN PATENT DOCUMENTS

| | | |
|---|---|---|
| JP | 56-61468 A | 5/1981 |
| JP | 56-61469 A | 5/1981 |
| JP | 60-252681 A | 12/1985 |
| JP | 2002-121510 A | 4/2002 |
| JP | 2003-64329 A | 3/2003 |

F I G. 1
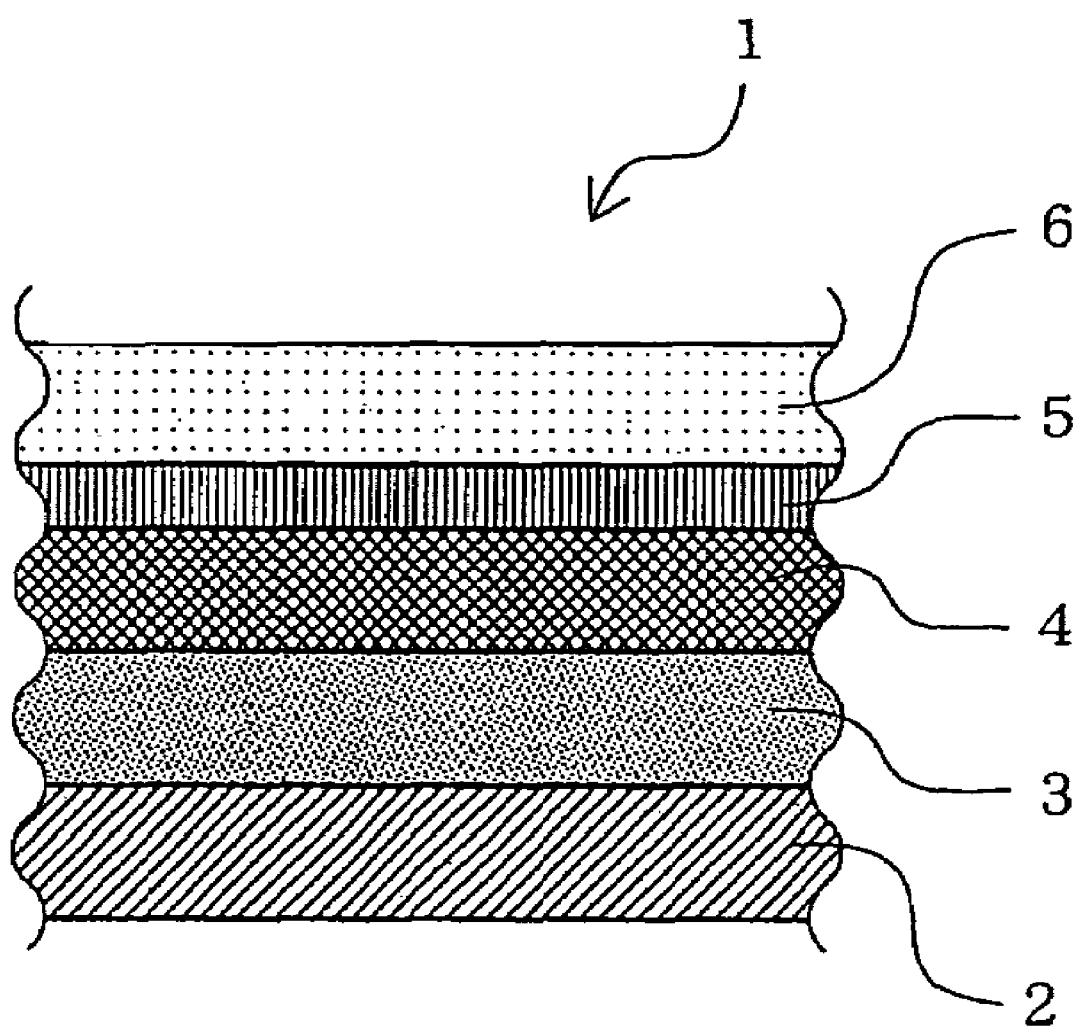

HEAT-PEELABLE PRESSURE-SENSITIVE ADHESIVE SHEET AND METHOD FOR PROCESSING ADHEREND USING THE HEAT-PEELABLE PRESSURE-SENSITIVE ADHESIVE SHEET

TECHNICAL FIELD

The present invention relates typically to heat-peelable pressure-sensitive adhesive sheets and methods for processing an adherend using the heat-peelable pressure-sensitive adhesive sheets.

BACKGROUND ART

Demands have been recently made on electronic components to have reduced sizes and increased precise. Ceramic capacitors, for example, must have reduced sizes such as "0603" size and "0402" size and have larger capacities as a result of high integration of layers in a number exceeding several hundreds. In particular, satisfactory processing accuracy has been required to realize size reduction and precision increase in laminating of ceramic sheets before firing (ceramic green sheets) typically for constituting ceramic capacitors.

Taking a method for producing a ceramic capacitor as an example, it includes, for example, the steps (processes) of (1) printing electrodes to green sheets, (2) laminating the printed green sheets, (3) pressing (pressing under pressure), (4) cutting, and (5) firing, in which the cutting process (4) is conducted after repeating the laminating process (2) and the pressing process (3) predetermined times.

Required precisions (accuracies) on these processes include the precision of printing electrodes in the process (1) of printing electrodes to green sheets; the precision of aligning electrodes in the laminating process (2); the precision of preventing misregistration of electrodes due to deformation of the green sheets as a result of pressurization in the pressing process (3); and the precision of cutting in the cutting process (4). Products become defective and have decreased productivity even when only one of these precisions is low in these processes.

Of these, the precisions required in the process (1) of printing electrodes to green sheets, the laminating process (2), and the cutting process (4) are mechanical precisions, and they can be achieved by realizing improvements in apparatuses and in precision. In the pressing process (3), however, the green sheets may deform and undergo misregistration as a result of pressurization (pressing under pressure), and this may cause the misregistration of electrodes and affect the precision of electrode registration in the green sheets laminated in the laminating process (2).

In current laminating processes (2), green sheets are generally laminated on poly(ethylene terephthalate) films (PET films) or pressure-sensitive adhesive tapes. Among them, the lamination of green sheets on pressure-sensitive adhesive tapes is increasingly employed from the viewpoints of size reduction and satisfactory anchoring (fixing) of green sheets in the subsequent cutting process.

Pressure-sensitive adhesive tapes used herein are adhesive tapes that exhibit tackiness (pressure-sensitive adhesion) at ordinary temperature so as to adhere to (fix) green sheets during the laminating process, pressing process, and cutting process, and have decreased tackiness as a result typically of heating or irradiation with ultraviolet rays, and can be peeled off after the cutting process. Examples of such adhesive tapes are heat-peelable pressure-sensitive adhesive sheets each including a substrate and a heat-expandable pressure-sensitive adhesive layer arranged at least on one side of the substrate; ultraviolet curable/peelable pressure-sensitive adhesive sheets; and low-tack adhesive tapes, as disclosed typically in Japanese Examined Patent Application Publication (JP-B) No. Sho 50-13878, JP-B No. Sho 51-24534, Japanese Unexamined Patent Application Publication (JP-A) No. Sho 56-61468, JP-A No. Sho 56-61469, and JP-A No. Sho 60-252681. More specifically, taking heat-peelable pressure-sensitive adhesive sheets as an example, they show both adhesiveness before heating and peelability after heating. Namely, after achieving the target adhesion, heat-expandable microspheres in the heat-expandable pressure-sensitive adhesive layer are heated to foam or expand, and the surface of the heat-expandable pressure-sensitive adhesive layer becomes uneven. This reduces the adhesion area (contact area) with an adherend (work) to thereby reduce the adhesive strength. Thus, the adherend can be easily peeled off (separated) from the adhesive tapes.

Such processes using pressure-sensitive adhesive tapes are generally used in production processes such as dicing and back grinding in the production of semiconductor components, some of which are expanded to use heat-peelable pressure-sensitive adhesive sheets.

DISCLOSURE OF INVENTION

However, a pressure-sensitive adhesive tape, if used in the production of ceramic capacitors having a reduced size and/or higher precision as mentioned above, may deform in its pressure-sensitive adhesive layer upon pressurization in the pressing process, which may cause deformation and thereby invite poor precision in the electrode registration. Materials having a high elastic modulus at ordinary temperature, such as PET films, are relatively resistant to such misregistration caused by pressurization.

It has been revealed that pressure-sensitive adhesive tapes preferably have a small thickness of adhesive (thickness of the pressure-sensitive adhesive layer) and a high elastic modulus so as to minimize chipping in grinding and cutting processes, such as dicing process, in the production processes of semiconductor components. However, heat-peelable pressure-sensitive adhesive sheets, if used as the pressure-sensitive adhesive tapes, are difficult to have a small thickness in the pressure-sensitive adhesive layer (heat-expandable pressure-sensitive adhesive layer), because the pressure-sensitive adhesive layer contains heat-expandable microspheres. A possible solution to reduce chipping in these adhesive sheets, therefore, is increase in elastic modulus of the pressure-sensitive adhesive layer.

Thus, heat-peelable pressure-sensitive adhesive sheets for use in electronic components and semiconductor components may possibly be those having a high elastic modulus of a pressure-sensitive adhesive constituting the heat-expandable pressure-sensitive adhesive layer. Accordingly, the present inventors prepared a heat-peelable pressure-sensitive adhesive sheet containing a substrate, and a heat-expandable pressure-sensitive adhesive layer arranged on or above at least one side of the substrate, which heat-expandable pressure-sensitive adhesive layer includes heat-expandable microspheres and has a shear modulus (23° C.) in an unfoamed state of $7 \times 10^6$ Pa or more. The heat-peelable pressure-sensitive adhesive sheet prevents deformation during pressing under pressure in the production of electronic components and prevents chipping to thereby realize reduced chipping in the production of semiconductor components. The adhesive sheet can have a reduced shear modulus of less than $7 \times 10^6$ Pa to thereby exhibit tackiness when heated at temperatures equal to or lower than foam initiating temperature of the heat-expandable microspheres in the heat-expandable pressure-sensitive adhesive layer. Thus, the adhesive sheet can act to adhere to (fix) the adherend in laminating in the production of electronic components and in cutting in the production of semiconductor components. In addition, the heat-peelable pressure-sensitive adhesive sheet can be easily peeled off from the adherend after the use thereof (for example, after the cutting process in the production of electronic components and after the dicing process in the production of semiconductor components) by heating to temperatures equal to or higher than the foam initiating temperature of the heat-expandable microspheres in the heat-expandable pressure-sensitive adhesive layer. This is because the heat-expandable microspheres in the heat-expandable pressure-sensitive adhesive layer foam or expand at such temperatures to thereby significantly reduce the tackiness.

The heat-peelable pressure-sensitive adhesive sheet of this type, however, is poor in tack of the heat-expandable pressure-sensitive adhesive layer and is thereby poor in adhesion at ordinary temperature, because the heat-expandable pressure-sensitive adhesive layer has a shear modulus at ordinary temperature (23° C.) in an unfoamed state of $7 \times 10^6$ Pa or more.

Accordingly, an object of the present invention is to provide a heat-peelable pressure-sensitive adhesive sheet, even if used in the production of electronic components and semiconductor components, which can prevent deformation of the pressure-sensitive adhesive layer as a result of pressurization during the pressing process and exhibit excellent tackiness so as to prevent misregistration of adherends during the laminating and cutting processes in the production of electronic components. The adhesive sheet can also exhibit excellent tackiness and realize further reduced chipping during the grinding and cutting processes in the production of semiconductor components and can be peeled off from an adherend (processed article) after the processing. In addition, the adhesive sheet, if used as a pressure-sensitive adhesive tape, can easily adhere to an adhered at ordinary temperature. Another object of the present invention is to provide a method for processing an adherend using the heat-peelable pressure-sensitive adhesive sheet.

Yet another object of the present invention is to provide a heat-peelable pressure-sensitive adhesive sheet that can contribute to improvement in component precision, reduction in size of the adherend, and improvement in yield to thereby effectively improve the productivity. Still another object of the present invention is to provide a method for processing an adherend using the heat-peelable pressure-sensitive adhesive sheet.

After intensive investigations to achieve the objects, the present inventors have found that a heat-peelable pressure-sensitive adhesive sheet having a specific layer configuration and including a heat-expandable pressure-sensitive adhesive layer having specific properties can achieve the objects, if used as a pressure-sensitive adhesive tape in the production of electronic components and semiconductor components. Specifically, the heat-peelable pressure-sensitive adhesive sheet can easily adhere to an adherend even at ordinary temperature, prevent deformation as a result of pressing under pressure in the production of electronic components, and realize further reduced chipping during dicing in the production of semiconductor components. The adhesive sheet can be easily peeled off from the processed article after processing. In addition, they have found that the heat-peelable pressure-sensitive adhesive sheet can also have such a configuration as to exhibit excellent tackiness in the laminating or cutting process in the production of electronic components. The present invention has been achieved based on these findings.

Specifically, the present invention provides a heat-peelable pressure-sensitive adhesive sheet comprising a substrate; and a heat-expandable pressure-sensitive adhesive layer arranged on or above at least one side of the substrate, the heat-expandable pressure-sensitive adhesive layer containing a foaming agent and having a shear modulus (23° C.) in an unfoamed state of $7 \times 10^6$ Pa or more, in which the adhesive sheet further comprises a pressure-sensitive adhesive layer being arranged on or above the heat-expandable pressure-sensitive adhesive layer and having a shear modulus (23° C.) of less than $7 \times 10^6$ Pa. The heat-expandable pressure-sensitive adhesive layer preferably comprises a pressure-sensitive adhesive having a shear modulus (23° C.) after being cured or dried of $7 \times 10^6$ Pa or more, and the pressure-sensitive adhesive layer arranged on or above the heat-expandable pressure-sensitive adhesive layer preferably comprises a pressure-sensitive adhesive having a shear modulus (23° C.) after being cured or dried of less than $7 \times 10^6$ Pa. The pressure-sensitive adhesive layer arranged on or above the heat-expandable pressure-sensitive adhesive layer has a thickness of 0.01 to 10 µm. The heat-expandable pressure-sensitive adhesive layer is preferably arranged above the substrate with the interposition of an organic rubber-like elastic layer.

The heat-expandable pressure-sensitive adhesive layer in the heat-peelable pressure-sensitive adhesive sheet can have a shear modulus (95° C.) in an unfoamed state of less than $7 \times 10^6$ Pa. The foaming agent in the heat-expandable pressure-sensitive adhesive layer preferably has a foam initiating temperature higher than 80° C.

The present invention further provides a method of processing an adherend, comprising the steps of applying the heat-peelable pressure-sensitive adhesive sheet to the adherend, and subjecting the adherend to processing. The adherend is preferably an article to be an electronic component and an article to be a semiconductor component.

The present invention still further provides an electronic component and a semiconductor component produced using the method of processing an adherend.

BRIEF DESCRIPTION OF THE DRAWINGS

FIG. 1 is a schematic cross-sectional view of a part of a heat-peelable pressure-sensitive adhesive sheet as an embodiment of the present invention.

BEST MODE FOR CARRYING OUT THE INVENTION

Certain embodiments of the present invention will be illustrated in detail below, with reference to the attached drawing according to necessity. Identical members and sections may have identical reference numerals.

[Heat-Peelable Pressure-Sensitive Adhesive Sheet]

The heat-peelable pressure-sensitive adhesive sheets according to the present invention have a configuration comprising a substrate, a heat-expandable pressure-sensitive adhesive layer, and a pressure-sensitive adhesive layer arranged in this order. The heat-expandable pressure-sensitive adhesive layer comprises heat-expandable microspheres as a foaming agent and has a shear modulus (23° C.) in an unfoamed state of $7 \times 10^6$ Pa or more. The pressure-sensitive adhesive layer arranged on or above the heat-expandable pressure-sensitive adhesive layer has a shear modulus (23° C.) of less than $7 \times 10^5$ Pa. These heat-peelable pressure-sensitive adhesive sheets include, for example, a pressure-sensitive adhesive sheet having the configuration shown in FIG. 1. FIG. 1 is a schematic cross-sectional view of a part of a heat-peelable pressure-sensitive adhesive sheet as an embodiment of the present invention. FIG. 1 illustrates a heat-peelable pressure-sensitive adhesive sheet 1, a substrate 2, an organic rubber-like elastic layer 3, a heat-expandable pressure-sensitive adhesive layer 4, a pressure-sensitive adhesive layer 5, and a separator (release liner) 6. The heat-expandable pressure-sensitive adhesive layer 4 has a shear modulus (23° C.) in an unfoamed state of $7 \times 10^6$ Pa or more, and the pressure-sensitive adhesive layer 5 has a shear modulus (23° C.) of less than $7 \times 10^6$ Pa.

Specifically, the heat-peelable pressure-sensitive adhesive sheet 1 in FIG. 1 comprises the substrate 2; the organic rubber-like elastic layer 3 arranged on or above one side of the substrate 2; the heat-expandable pressure-sensitive adhesive layer 4 arranged on the organic rubber-like elastic layer 3; and the pressure-sensitive adhesive layer 5 arranged on the heat-expandable pressure-sensitive adhesive layer 4, in which the pressure-sensitive adhesive layer 5 is protected by the separator 6. The heat-expandable pressure-sensitive adhesive layer 4 has a shear modulus (23° C.) in an unfoamed state of $7 \times 10^6$ Pa or more, and the pressure-sensitive adhesive layer 5 has a shear modulus (23° C.) of less than $7 \times 10^6$ Pa. The organic rubber-like elastic layer 3 can be optionally arranged.

The heat-peelable pressure-sensitive adhesive sheets according to the present invention each comprise the heat-expandable pressure-sensitive adhesive layer having a shear modulus (23° C.) in an unfoamed state of $7 \times 10^6$ Pa or more and the pressure-sensitive adhesive layer being arranged on or above the heat-expandable pressure-sensitive adhesive layer and having a shear modulus (23° C.) of less than $7 \times 10^6$ Pa. Accordingly, they exhibit elasticity and excellent adhesiveness. When they are used, for example, in the pressing process (pressing under pressure), laminating process, and cutting process in the production of electronic components, they can prevent the deformation of the heat-expandable pressure-sensitive adhesive layer upon pressurization and inhibit the misregistration of the adherend during laminating and cutting by carrying out the pressurization (pressing under pressure), laminating, and cutting at room temperature. When they are used in the grinding process, such as a back grinding process, and the cutting process, such as a dicing process, in the production of semiconductor components, they can prevent the chipping by carrying out back grinding and dicing at room temperature. The chipping herein refers to damages of components such as articles to be a semiconductor component, including silicon wafers, and articles to be an electronic component. The heat-peelable pressure-sensitive adhesive sheets according to the present invention, if used in adherend processing, can more satisfactorily prevent the deformation of the heat-expandable pressure-sensitive adhesive layer during pressing process in the production of electronic components and can more satisfactorily prevent the misregistration of the adherend during laminating and cutting processes in the production of electronic components. They can also realize further reduced chipping (or further prevented chipping) during grinding and cutting processes in the production of semiconductor components.

The heat-peelable pressure-sensitive adhesive sheets, when used in processing of an adherend, such as an article to be an electronic component or an article to be a semiconductor component, can improve the precision of the processed article or component, enable the article or component to have reduced size, improve yields, and thereby improve the productivity.

The heat-expandable pressure-sensitive adhesive layer preferably has a shear modulus (23° C.) in an unfoamed state of $7 \times 10^6$ Pa or more and a shear modulus (80° C.) in an unfoamed state of less than $7 \times 10^6$ Pa, and more preferably has a shear modulus (23° C.) in an unfoamed state of $7 \times 10^6$ Pa or more and a shear modulus (95° C.) in an unfoamed state of less than $7 \times 10^6$ Pa. By satisfying this, the adhesive sheets can adhere to the adherend more firmly by heating. It should be noted that the temperature in heating herein must be a temperature lower than the foam initiating temperature of the foaming agent in the heat-expandable pressure-sensitive adhesive layer. In processes requiring tackiness, such as laminating and cutting processes in the production of electronic components, or grinding and cutting processes in the production of semiconductor components, the adhesive sheets can exhibit more firm adhesion upon laminating and cutting, or upon back grinding and dicing, by carrying out laminating and cutting, or back grinding and dicing after once heating the adhesive sheets. It should be noted that the temperature in heating herein must be a temperature lower than the foam initiating temperature of the foaming agent in the heat-expandable pressure-sensitive adhesive layer. Where necessary, the adhesive sheets can be cooled to room temperature after heating and before processing. The heat-peelable pressure-sensitive adhesive sheets, if having these properties, can satisfy both elasticity and adhesiveness at high levels, which elasticity is required in the pressing process in the production of electronic components, and which adhesiveness is required in the laminating and cutting processes in the production of electronic components, and in the grinding and cutting processes in the production of semiconductor components. The adhesive sheets can therefore further improve the precision of the processed article or component, enable the article or component to have a further reduced size, improve yields, and thereby further increase the productivity.

The heat-peelable pressure-sensitive adhesive sheets can be easily peeled off from the processed article, such as an electronic component or a semiconductor component, by carrying out a heat treatment after processing.

(Substrate)

The substrate can serve as a matrix for supporting the heat-expandable pressure-sensitive adhesive layer, the pressure-sensitive adhesive layer, and other layers. The substrate can be any suitable thin article including paper substrates such as paper; fibrous substrates such as woven or nonwoven fabrics and nets; metallic substrates such as metal foil and metal sheets; plastic substrates such as plastic films and sheets; rubber substrates such as rubber sheets; foamed articles such as foamed sheets; and laminates of these materials. Of such laminates, laminates of a plastic substrate with another substrate, and laminates of plastic films or sheets with each other are preferred. The substrate is preferably one that has excellent thermal stability and is not molten at temperatures in the heat treatment of the heat-expandable pressure-sensitive adhesive layer. Such a substrate shows good handleability after heating. The substrate is preferably a plastic substrate such as a plastic film or sheet. Examples of the materials for such plastic films and sheets include olefinic resins comprising an α-olefin as a monomer component, such as polyethylenes (PEs), polypropylenes (PPs), ethylene-propylene copolymers, and ethylene-vinyl acetate copolymers (EVAs); polyesters such as poly(ethylene terephthalate)s (PETs), poly(ethylene naphthalate)s (PENs), and poly(butylene terephthalate)s (PBTs); poly(vinyl chloride)s (PVCs); poly(phenylene sulfide)s (PPSs); amide resins such as polyamides (nylons) and wholly aromatic polyamides (aramids);

and poly(ether ether ketone)s (PEEKs). Each of these materials can be used alone or in combination.

A plastic substrate, if used as the substrate, can be controlled upon percentage of elongation and other deformation properties typically by drawing. When a radiation curable substance is used typically in the heat-expandable pressure-sensitive adhesive layer, the substrate is preferably one that does not inhibit the transmission of the radiation.

The thickness of the substrate can be appropriately selected according to the strength, flexibility, and objected use of the substrate, and is generally about 1000 μm or less, for example, about 1 to about 1000 μm, preferably about 1 to about 500 μm, more preferably about 3 to about 300 μm, and particularly preferably about 5 to about 250 μm. The thickness, however, is not specifically limited. The substrate can comprise a single layer or multiple layers.

The surface of the substrate can be subjected, for example, to a conventional surface treatment and/or coating with a primer for increasing the adhesion typically with the heat-expandable pressure-sensitive adhesive layer. Examples of the surface treatment include corona treatment, chromium acid treatment, exposure to ozone, exposure to flame, exposure to high-pressure electric shock, and other chemical or physical oxidation treatments. The surface can be coated, for example, with a release agent such as a silicone resin or fluorocarbon resin, for imparting the peelability typically from the heat-expandable pressure-sensitive adhesive layer.

The heat-expandable pressure-sensitive adhesive layer is arranged on or above at least one side (one side or both sides) of the substrate with or without the interposition of an intermediate layer such as an organic rubber-like elastic layer. The substrate may be embedded in the heat-expandable pressure-sensitive adhesive layer.

(Heat-Expandable Pressure-Sensitive Adhesive Layer)

The heat-expandable pressure-sensitive adhesive layer has a shear modulus (23° C.) in an unfoamed state after being cured or dried of $7\times10^6$ Pa or more, as is mentioned above. The shear modulus herein is preferably $1\times10^7$ Pa or more. It is preferred that the heat-expandable pressure-sensitive adhesive layer has a shear modulus (23° C.) in an unfoamed state after being cured or dried of $7\times10^6$ Pa or more, preferably $1\times10^7$ Pa or more, and has a shear modulus (80° C.) in an unfoamed state after being cured or dried of less than $7\times10^6$ Pa, preferably $5\times10^6$ Pa or less. It is more preferred that the heat-expandable pressure-sensitive adhesive layer has a shear modulus (23° C.) in an unfoamed state after being cured or dried of $7\times10^6$ Pa or more, preferably $1\times10^7$ Pa or more, and has a shear modulus (95° C.) in an unfoamed state after being cured or dried of less than $7\times10^6$ Pa, preferably $5\times10^6$ Pa or less.

The "shear modulus" used in the present specification means a shear storage elastic modulus. The procedure for determining the shear modulus (shear storage elastic modulus) of the heat-expandable pressure-sensitive adhesive layer can be, but not specifically limited to, a conventional determination procedure of dynamic viscoelastic properties. More specifically, a dynamic viscoelastometer as the product of Rheometrics Inc. under the trade name of "ARES" can be used. The determination can be carried out under such conditions at temperatures of 23° C., and 80° C. or 95° C., a frequency of 1 Hz, a sample thickness (the thickness of the heat-expandable pressure-sensitive adhesive layer) of about 1.0 mm or about 2.0 mm, and a strain of 0.1% (23° C.) or 0.3% (80° C. or 95° C.), using a jig including parallel plates having a plate diameter of 7.9 mm. The higher temperature (80° C. or 95° C.) in the determination of the shear modulus is more preferably set at 95° C. than at 80° C., from the viewpoints of reproducibility and precision in the determination. The thickness of the heat-expandable pressure-sensitive adhesive layer is more preferably set at about 2.0 mm than at about 1.0 mm, from the viewpoint of reducing the error in thickness of the heat-expandable pressure-sensitive adhesive layer.

The shear modulus of the pressure-sensitive adhesive constituting the heat-expandable pressure-sensitive adhesive layer can be controlled by adjusting the types and contents of base polymers and additives, such as crosslinking agents and tackifiers, in the pressure-sensitive adhesive, and the type and content of the foaming agent such as heat-expandable microspheres.

The heat-expandable pressure-sensitive adhesive layer comprises a pressure-sensitive adhesive for imparting tackiness, and a foaming agent for imparting thermal expandability, as is described above. Consequently, the heat-peelable pressure-sensitive adhesive sheet can be easily peeled off from an adherend by heating at any arbitrary time after the heat-peelable pressure-sensitive adhesive sheet is, for example, applied to the adherend including a member or component such as a semiconductor wafer by using the pressure-sensitive adhesive layer [the pressure-sensitive adhesive layer having a shear modulus (23° C.) of less than $7\times10^6$ Pa] arranged on or above the heat-expandable pressure-sensitive adhesive layer. In this procedure, the heat-expandable pressure-sensitive adhesive layer is heated to thereby allow the foaming agent, such as heat-expandable microspheres, to foam and/or expand. Accordingly, the heat-expandable pressure-sensitive adhesive layer expands, and this expansion reduces the adhesion area (contact area) between the adherend and the pressure-sensitive adhesive layer arranged on or above the heat-expandable pressure-sensitive adhesive layer to thereby reduce the adhesive strength of the pressure-sensitive adhesive layer.

The forming agent for use in the heat-expandable pressure-sensitive adhesive layer can be preferably, but is not specifically limited to, heat-expandable microspheres. Each of these foaming agents can be used alone or in combination. The heat-expandable microspheres (microcapsules) can be appropriately selected from among known heat-expandable microspheres. The heat-expandable microspheres are preferably those comprising a foaming agent formulated into microcapsules, because some foaming agents not formulated into microcapsules may not stably exhibit satisfactory peelability. Examples of the heat-expandable microspheres for use herein are microspheres comprising elastic shells and a substance contained therein, which substance can easily gasify and expand by heating, such as isobutane, propane, or pentane. The shells often comprise a thermofusible material or a material that breaks as a result of thermal expansion. Materials for constituting the shells include vinylidene chloride-acrylonitrile copolymers, poly(vinyl alcohol)s, poly(vinyl butyral)s, poly(methyl methacrylate)s, polyacrylonitriles, poly(vinylidene chloride)s, and polysulfones. The heat-expandable microspheres can be prepared according to a conventional procedure such as coacervation or interfacial polymerization. The heat-expandable microspheres can also be obtained as commercial products such as the products of Matsumoto Yushi-Seiyaku Co., Ltd. under the trade name of "Matsumoto Microsphere".

The foaming agent for use in the present invention can also be any other foaming agents than heat-expandable microspheres. Any foaming agents such as inorganic foaming agents and organic foaming agents can be appropriately selected as the foaming agent. Representative examples of inorganic foaming agents include ammonium carbonate, ammonium hydrogen carbonate, sodium hydrogen carbonate, ammonium nitrite, sodium borohydroxide, and azides. Representative examples of organic foaming agents include water; chlorofluoroalkane compounds such as trichloromonofluoromethane and dichloromonofluoromethane; azo compounds such as azobisisobutyronitrile, azodicarbonamide, and barium azodicarboxylate; hydrazine compounds such as p-toluenesulfonyl hydrazide, diphenylsulfone-3,3'-disulfonyl hydrazide, 4,4'-oxybis(benzenesulfonyl hydrazide), and allylbis(sulfonyl hydrazide); semicarbazide compounds such as p-toluoylenesulfonyl semicarbazide, and 4,4'-oxybis(benzenesulfonyl semicarbazide); triazole compounds such as 5-morpholyl-1,2,3,4-thiatriazole; and N-nitroso compounds such as N,N'-dinitrosopentamethylenetetramine and N,N'-dimethyl-N,N'-dinitrosoterephthalamide.

The thermal expansion starting temperature (foam initiating temperature) of the foaming agent such as heat-expandable microspheres is not specifically limited but is preferably higher than 80° C. and more preferably higher than 95° C. The thermal expansion starting temperature of the foaming agent such as heat-expandable microspheres is, for example, preferably about 85° C. to about 200° C., more preferably about 100° C. to about 200° C., and particularly preferably about 100° C. to about 170° C.

The "thermal expansion starting temperature (foam initiating temperature)" of the foaming agent such as heat-expandable microspheres in the present invention means the temperature at which the foaming agent begins expanding (foaming) upon heating. It corresponds typically to the peel initiating temperature of the heat-peelable pressure-sensitive adhesive sheet including the heat-expandable pressure-sensitive adhesive layer containing the foaming agent such as heat-expandable microspheres. The peel initiating temperature of the heat-peelable pressure-sensitive adhesive sheet can be, for example, the minimum (lowest) heat treatment temperature at which the adhesive strength of the heat-expandable pressure-sensitive adhesive layer containing the foaming agent such as heat-expandable microspheres can be reduced, as a result of heat treatment, to 10% or less of the adhesive strength before heating. Accordingly, the thermal expansion starting temperature of the foaming agent such as heat-expandable microspheres can be determined by measuring the peel initiating temperature of the heat-peelable pressure-sensitive adhesive sheet including the heat-expandable pressure-sensitive adhesive layer containing the foaming agent such as heat-expandable microspheres. Namely, it can be determined by measuring the minimum (lowest) heat treatment temperature at which the adhesive strength of the heat-expandable pressure-sensitive adhesive layer containing the foaming agent such as heat-expandable microspheres can be reduced, as a result of heat treatment, to 10% or less of the adhesive strength before heating. More specifically, the thermal expansion starting temperature can be determined in the following manner. A poly(ethylene terephthalate) film [the product of Toray Industries, Ltd. under the trade name of "Lumirror S10 #25"; hereinafter also referred to as "PET film"] having a width of 20 mm and a thickness of 23 μm is applied to the surface of the heat-expandable pressure-sensitive adhesive layer of a sample heat-peelable pressure-sensitive adhesive sheet, containing the foaming agent such as heat-expandable microspheres, using a hand roller so as not include bubbles to thereby yield a test piece. Thirty minutes into the application, the PET film is peeled off from the adhesive sheet at a peel angle of 180 degrees, and the adhesive strength herein is measured at a measurement temperature of 23° C., a rate of pulling of 300 mm/min, and a peel angle of 180 degrees. The measured adhesive strength is defined as the "initial adhesive strength". Another test piece prepared by the above procedure is placed in a circotherm drier set at each temperature (heat treatment temperature) for one minute, is then taken out from the circotherm drier, and is left stand at 23° C. for two hours. Next, the PET film is peeled off from the adhesive sheet at a peel angle of 180 degrees, and the adhesive strength herein is measured at a measurement temperature of 23° C., a rate of pulling of 300 mm/min, and a peel angle of 180 degrees. The measured adhesive strength is defined as the "adhesive strength after heat treatment". Next, the minimum (lowest) heat treatment temperature at which the adhesive strength after heat treatment is 10% or less of the initial adhesive strength is determined. The minimum (lowest) heat treatment temperature can be used as the thermal expansion starting temperature of the foaming agent such as heat-expandable microspheres.

The foaming agent preferably has such a suitable strength as not to burst or blow even at a coefficient of cubic expansion of 5 times or more, more preferably 7 times or more, particularly preferably 10 times or more. By satisfying this, the adhesive strength of the heat-expandable pressure-sensitive adhesive layer may be efficiently and stably reduced by heat treatment.

The amount of the foaming agent such as heat-expandable microspheres can be suitably set according to the coefficient of expansion and the degree of reduction in adhesive strength of the heat-expandable pressure-sensitive adhesive layer, and is generally, for example, 1 to 150 parts by weight, preferably 10 to 130 parts by weight, and more preferably 25 to 100 parts by weight, to 100 parts by weight of the base polymer of the pressure-sensitive adhesive constituting the heat-expandable pressure-sensitive adhesive layer.

The particle size (average particle diameter) of heat-expandable microspheres, if used as the foaming agent, can be appropriately set according typically to the thickness of the heat-expandable pressure-sensitive adhesive layer. The average particle diameter of the heat-expandable microspheres can be selected within the range of, for example, 100 μm or less, preferably 80 μm or less, more preferably 1 to 50 μm, and particularly preferably 1 to 30 μm. The control of the particle size of the heat-expandable microspheres can be carried out during the preparation of the heat-expandable microspheres, or typically by classification after the preparation.

The pressure-sensitive adhesive used for constituting the heat-expandable pressure-sensitive adhesive layer can be a pressure-sensitive adhesive having a shear modulus (23° C.) after being cured or dried of $7 \times 10^6$ Pa or more, and preferably $1 \times 10^7$ Pa or more. Among such pressure-sensitive adhesives, preferred are those having a shear modulus (23° C.) after being cured or dried of $7 \times 10^6$ Pa or more, preferably $1 \times 10^7$ Pa or more, and having a shear modulus (80° C.) after being cured or dried of less than $7 \times 10^6$ Pa, preferably $5 \times 10^6$ Pa or less, of which more preferred are those having a shear modulus (23° C.) after being cured or dried of $7 \times 10^6$ Pa or more, preferably $1 \times 10^7$ Pa or more, and having a shear modulus (95° C.) after being cured or dried of less than $7 \times 10^6$ Pa, preferably $5 \times 10^6$ Pa or less.

The pressure-sensitive adhesive is not specifically limited, as long as it has the above-mentioned properties, but is preferably one that shows minimum restriction on the foaming and/or expansion of the foaming agent such as heat-expandable microspheres upon heating. The pressure-sensitive adhesive can be selected as a pressure-sensitive adhesive having the above-mentioned properties, from among known pressure-sensitive adhesives. Examples thereof include rubber pressure-sensitive adhesives, acrylic pressure-sensitive adhesives, vinyl alkyl ether pressure-sensitive adhesives, silicone pressure-sensitive adhesives, polyester pressure-sensitive adhesives, polyamide pressure-sensitive adhesives, urethane pressure-sensitive adhesives, fluorine-containing pressure-sensitive adhesives, styrene-diene block copolymer pressure-sensitive adhesives, and pressure-sensitive adhesives being modified in creep behavior by incorporating a hot melt resin having a melting point of about 200° C. or below to these pressure-sensitive adhesives. Such pressure-sensitive adhesives can be found in, for example, JP-A No. Sho 56-61468, JP-A No. Sho 61-174857, JP-A No. Sho 63-17981, and JP-A No. Sho 56-13040. Radiation-curable pressure-sensitive adhesives or energy ray-curable pressure-sensitive adhesives can also be used as the pressure-sensitive adhesive. Each of these pressure-sensitive adhesives can be used alone or in combination.

When two or more different pressure-sensitive adhesives constitute the pressure-sensitive adhesive herein, the resulting pressure-sensitive adhesive must essentially have the above-mentioned properties.

Rubber pressure-sensitive adhesives and acrylic pressure-sensitive adhesives are preferred as the pressure-sensitive adhesive, of which acrylic pressure-sensitive adhesives are more preferred. Examples of rubber pressure-sensitive adhesives are rubber pressure-sensitive adhesives comprising various natural rubbers and synthetic rubbers as base polymers. Such rubbers include polyisoprene rubber, styrene-butadiene (SB) rubber, styrene-isoprene (SI) rubber, styrene-isoprene-styrene block copolymer (SIS) rubber, styrene-butadiene-styrene block copolymer (SBS) rubber, styrene-ethylene-butylene-styrene block copolymer (SEBS) rubber, styrene-ethylene-propylene-styrene block copolymer (SEPS) rubber, styrene-ethylene-propylene block copolymer (SEP) rubber, reclaimed rubber, butyl rubber, polyisobutylenes, and modified products of these.

The acrylic pressure-sensitive adhesives include acrylic pressure-sensitive adhesives comprising acrylic polymers (homopolymers or copolymers) as base polymers, the acrylic polymers each use one or more (meth)acrylic acid alkyl esters as monomer components. Examples of (meth)acrylic acid alkyl esters for use in the acrylic pressure-sensitive adhesives include (meth)acrylic acid $C_{1-20}$ alkyl esters such as methyl (meth)acrylates, ethyl (meth)acrylates, propyl (meth)acrylates, isopropyl (meth)acrylates, butyl (meth)acrylates, isobutyl (meth)acrylates, s-butyl (meth)acrylates, t-butyl (meth)acrylates, pentyl (meth)acrylates, hexyl (meth)acrylates, heptyl (meth)acrylates, octyl (meth)acrylates, 2-ethylhexyl (meth)acrylates, isooctyl (meth)acrylates, nonyl (meth)acrylates, isononyl (meth)acrylates, decyl (meth)acrylates, isodecyl (meth)acrylates, undecyl (meth)acrylates, dodecyl (meth)acrylates, tridecyl (meth)acrylates, tetradecyl (meth)acrylates, pentadecyl (meth)acrylates, hexadecyl (meth)acrylates, heptadecyl (meth)acrylates, octadecyl (meth)acrylates, nonadecyl (meth)acrylates, and eicosyl (meth)acrylates, of which (meth)acrylic acid $C_{4-18}$ alkyl (straight- or branched-chain alkyl) esters are preferred.

The acrylic polymers may further comprise one or more units corresponding to other monomer components that are copolymerizable with the (meth)acrylic acid alkyl esters, for the purpose of improving, for example, the cohesive force, thermal stability, and/or crosslinking property. Such monomer components include, for example, carboxyl-containing monomers such as acrylic acid, methacrylic acid, carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl-containing monomers such as hydroxyethyl (meth)acrylates, hydroxypropyl (meth)acrylates, hydroxybutyl (meth)acrylates, hydroxyhexyl (meth)acrylates, hydroxyoctyl (meth)acrylates, hydroxydecyl (meth)acrylates, hydroxylauryl (meth)acrylates, and (4-hydroxymethylcyclohexyl)methyl methacrylate; sulfonic group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylates, and (meth)acryloyloxynaphthalenesulfonic acid; phosphoric group-containing monomers such as 2-hydroxyethylacryloyl phosphate; (N-substituted) amide monomers such as (meth)acrylamides, N,N-dimethyl(meth)acrylamides, N-butyl(meth)acrylamides, N-methylol(meth)acrylamides, and N-methylolpropane(meth)acrylamides; aminoalkyl (meth)acrylate monomers such as aminoethyl (meth)acrylates, N,N-dimethylaminoethyl (meth)acrylates, and t-butylaminoethyl (meth)acrylates; alkoxyalkyl (meth)acrylate monomers such as methoxyethyl (meth)acrylates and ethoxyethyl (meth)acrylates; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylenesuccinimide, N-(meth)acryloyl-6-oxyhexamethylenesuccinimide, and N-(meth)acryloyl-8-oxyoctamethylenesuccinimide; vinyl monomers such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxamides, styrene, α-methylstyrene, and N-vinylcaprolactam; cyano acrylate monomers such as acrylonitrile and methacrylonitrile; epoxy group-containing acrylic monomers such as glycidyl (meth)acrylates; glycol acrylate monomers such as polyethylene glycol (meth)acrylates, polypropylene glycol (meth)acrylates, methoxyethylene glycol (meth)acrylates, and methoxypolypropylene glycol (meth)acrylates; acrylate monomers containing, for example, a heterocyclic ring, halogen atom, or silicon atom, such as tetrahydrofurfuryl (meth)acrylates, fluorine (meth)acrylates, and silicone (meth)acrylates; polyfunctional monomers such as hexanediol di(meth)acrylates, (poly)ethylene glycol di(meth)acrylates, (poly)propylene glycol di(meth)acrylates, neopentyl glycol di(meth)acrylates, pentaerythritol di(meth)acrylates, trimethylolpropane tri(meth)acrylates, pentaerythritol tri(meth)acrylates, dipentaerythritol hexa(meth)acrylates, epoxy acrylates, polyester acrylates, urethane acrylates, divinylbenzene, butyl di(meth)acrylates, and hexyl di(meth)acrylates; olefinic monomers such as isoprene, butadiene, and isobutylene; and vinyl ether monomers such as vinyl ether. Each of these monomer components can be used alone or in combination.

The pressure-sensitive adhesive may further comprise suitable additives according typically to the type of the pressure-sensitive adhesive, in addition to polymer components such as a pressure-sensitive adhesive component (base polymer). Such additives include, for example, crosslinking agents such as polyisocyanates and alkyl etherified melamine compounds; tackifiers including those which are solid, semi-solid, or liquid at ordinary temperature, typically comprising rosin derivative resins, polyterpene resins, petroleum resins, and oil-soluble phenolic resins; plasticizers; fillers; and age resistors (antioxidants).

The heat-expandable pressure-sensitive adhesive layer can be formed according to a conventional procedure. For example, it can be formed by mixing the pressure-sensitive adhesive and the foaming agent such as heat-expandable microspheres, where necessary with a solvent and other additives, and forming the mixture into a sheet-like layer. More specifically, the heat-expandable pressure-sensitive adhesive layer can be formed, for example, by a process of applying the mixture to the substrate or the after-mentioned organic rubber-like elastic layer, which mixture contains the pressure-sensitive adhesive, the foaming agent such as heat-expandable microspheres, where necessary with a solvent and other additives; or by a process of applying the mixture to a suitable separator such as release paper to form a heat-expandable pressure-sensitive adhesive layer, and transferring the layer onto the substrate or the organic rubber-like elastic layer. The application of the heat-expandable pressure-sensitive adhesive layer can use a device that is generally used in spin coating or in a regular pressure-sensitive adhesive applicator, such as fan tender coater or kiss coater.

The heat-expandable pressure-sensitive adhesive layer may comprise a single layer or multiple layers.

The thickness of the heat-expandable pressure-sensitive adhesive layer can be appropriately selected according typically to the degree of reduction in adhesive strength and is generally about 5 to about 300 μm, and preferably about 20 to about 150 μm. When heat-expandable microspheres are used as the foaming agent, the thickness of the heat-expandable pressure-sensitive adhesive layer is preferably greater than the largest particle size of the heat-expandable microspheres contained therein. A heat-expandable pressure-sensitive adhesive layer having an excessively small thickness may have poor surface smoothness due to protrusions and depressions caused by the heat-expandable microspheres and have decreased adhesiveness before heating (in an unfoamed state). This heat-expandable pressure-sensitive adhesive layer may also show less deformation upon heat treatment to thereby have an adhesive strength not smoothly decreasing. In contrast, a heat-expandable pressure-sensitive adhesive layer having an excessively large thickness may often undergo cohesive failure after foaming as a result of heat treatment.

(Pressure-Sensitive Adhesive Layer)

The pressure-sensitive adhesive layer arranged on or above the heat-expandable pressure-sensitive adhesive layer (hereinafter also referred to as "surface pressure-sensitive adhesive layer") is used as a pressure-sensitive adhesive layer to be applied or to adhere to an adherend. The surface pressure-sensitive adhesive layer has a feature of having a shear modulus (23° C.) of less than $7 \times 10^6$ Pa, as is described above. The shear modulus (23° C.) is preferably $5 \times 10^6$ Pa or less, The surface pressure-sensitive adhesive layer can thereby exhibit excellent adhesiveness at ordinary temperature (23° C.). Accordingly, the heat-peelable pressure-sensitive adhesive sheet can be easily applied to the adherend even at ordinary temperature, because the surface pressure-sensitive adhesive layer can exhibit excellent adhesiveness at ordinary temperature.

A pressure-sensitive adhesive constituting the surface pressure-sensitive adhesive layer can be a pressure-sensitive adhesive which will have a shear modulus (23° C.) of less than $7 \times 10^6$ Pa, preferably $5 \times 10^6$ Pa or less, after being cured or dried. The pressure-sensitive adhesive constituting the surface pressure-sensitive adhesive layer is not specifically limited, as long as it has the above-mentioned properties. It can be any of known or conventional pressure-sensitive adhesives including those exemplified as pressure-sensitive adhesives for use in the heat-expandable pressure-sensitive adhesive layer. Examples of such pressure-sensitive adhesives include rubber pressure-sensitive adhesives, acrylic pressure-sensitive adhesives, vinyl alkyl ether pressure-sensitive adhesives, silicone pressure-sensitive adhesives, polyester pressure-sensitive adhesives, polyamide pressure-sensitive adhesives, urethane pressure-sensitive adhesives, fluorine-containing pressure-sensitive adhesives, styrene-diene block copolymer pressure-sensitive adhesives, pressure-sensitive adhesives modified in creep behaviour, and radiation-curable pressure-sensitive adhesives. Each of these pressure-sensitive adhesives can be used alone or in combination. The pressure-sensitive adhesive for constituting the surface pressure-sensitive adhesive layer may further comprise known or conventional additives such as plasticizers, fillers, surfactants, age resistors (antioxidants), and tackifiers.

The surface pressure-sensitive adhesive layer may expand upon heating, but preferably does not expand upon heating. Specifically, the surface pressure-sensitive adhesive layer is preferably a non-heat-expandable pressure-sensitive adhesive layer.

The thickness of the surface pressure-sensitive adhesive layer is not specifically limited, but can be set within the range of 0.01 to 10 μm, preferably 0.02 to 5 μm, and more preferably about 0.05 to 2 μm. A surface pressure-sensitive adhesive layer having an excessively large thickness may absorb the peel force as a result of foaming of the heat-expandable pressure-sensitive adhesive layer by heating, and this may invite reduced heat-peelability of the adhesive sheet. In contrast, a surface pressure-sensitive adhesive layer having an excessively small thickness may not sufficiently develop its tackiness and fail to firmly fix the adherend.

The surface pressure-sensitive adhesive layer can be formed by the same procedure as in the heat-expandable pressure-sensitive adhesive layer. For example, it can be formed by coating a material mixture to the substrate; or by applying the mixture to a separator and then transferring the resulting layer onto the substrate. The application of the surface pressure-sensitive adhesive layer can use a device that is generally used in spin coating or in a regular pressure-sensitive adhesive applicator, such as fan tender coater or kiss coater.

The surface pressure-sensitive adhesive layer can comprise a single layer or multiple layers.

(Intermediate Layer)

The heat-peelable pressure-sensitive adhesive sheets according to the present invention may further comprise one or more intermediate layers. Such intermediate layers include a coating layer of a release agent for imparting peelability, and a primer coating layer for improving the adhesion strength. Other intermediate layers than the release agent coating layer and the primer coating layer include, for example, a layer for imparting satisfactory deformability; a layer for increasing the adhesion area with an adherend such as a semiconductor wafer; a layer for improving the adhesive strength; a layer for enabling the sheet to lie in good accordance with the surface of the adherend such as a semiconductor wafer; a layer for improving the treating ability in reduction of the adhesive strength by heating; and a layer for improving the peelability of the sheet from the adherend such as a semiconductor wafer after heating. Among them, an organic rubber-like elastic layer is preferably arranged as an intermediate layer between the substrate and the heat-expandable pressure-sensitive adhesive layer as illustrated in FIG. 1, from the viewpoints typically of imparting deformability to the heat-peelable pressure-sensitive adhesive sheet.

The heat-peelable pressure-sensitive adhesive sheet 1 illustrated in FIG. 1 comprises a heat-expandable pressure-sensitive adhesive layer 4 arranged above a substrate 2 with the interposition of an organic rubber-like elastic layer 3. By arranging the organic rubber-like elastic layer, the heat-peelable pressure-sensitive adhesive sheet, when applied to an adherend, enables its surface (the surface of the heat-expandable pressure-sensitive adhesive layer) to lie in good accordance with the surface of the adherend to thereby have an increased adhesion area. The heat-peelable pressure-sensitive adhesive sheet can control the expansion of the heat-expandable pressure-sensitive adhesive layer with good precision upon heating to thereby allow the heat-expandable pressure-sensitive adhesive layer to expand preferentially in a thickness direction uniformly, when the sheet is peeled off from the adherend by heating. Specifically, the organic rubber-like elastic layer can act to provide a larger adhesion area upon the adhesion of the heat-peelable pressure-sensitive adhesive sheet with the adherend, because the surface of the adhesive sheet can lie in satisfactory accordance with the surface dimensions of the adhered. In addition, it can act to reduce the constraint of the foaming and/or expansion of the heat-peelable pressure-sensitive adhesive sheet in a plane direction when the heat-expandable pressure-sensitive adhesive layer is heated to allow the layer to foam and/or expand so as to peel off the heat-peelable pressure-sensitive adhesive sheet from the adherend. In other words, it can act to promote the formation of waviness structure due to three-dimensional structural change of the heat-expandable pressure-sensitive adhesive layer.

The organic rubber-like elastic layer is a layer that is provided according to necessary, and is not always necessary.

The organic rubber-like elastic layer is preferably arranged upon the heat-expandable pressure-sensitive adhesive layer on its side facing the substrate so as to superimpose the heat-expandable pressure-sensitive layer. The organic rubber-like elastic layer can also be arranged as a layer other than the intermediate layer between the substrate and the heat-expandable pressure-sensitive adhesive layer. The organic rubber-like elastic layer can be arranged on or above one or both sides of the substrate.

The organic rubber-like elastic layer preferably comprises a natural rubber, a synthetic rubber, or a synthetic resin showing rubber elasticity, each of which has a Shore D hardness according to ASTM D-2240 of, for example, 50 or less, and particularly preferably 40 or less. The synthetic rubbers or synthetic resins showing rubber elasticity include, for example, synthetic rubbers such as nitrile rubbers, diene rubbers, and acrylic rubbers; thermoplastic elastomers such as polyolefin elastomers and polyester elastomers; and synthetic resins showing rubber elasticity, such as ethylene-vinyl acetate copolymers, polyurethanes, polybutadienes, and flexible poly(vinyl chloride)s. In this connection, inherently rigid polymers such as poly(vinyl chloride)s can exhibit rubber elasticity by incorporating compounding ingredients such as plasticizers or flexibilizers into them. The resulting compositions can also be used as materials for constituting the organic rubber-like elastic layer. Pressure-sensitive adhesive substances, such as pressure-sensitive adhesives constituting the heat-expandable pressure-sensitive adhesive layer, can also be used as materials for constituting the organic rubber-like elastic layer.

The organic rubber-like elastic layer can be formed, for example, by applying a coating composition to the substrate, which coating composition comprises materials for constituting the organic rubber-like elastic layer, such as the natural rubber, synthetic rubber, or synthetic resin showing rubber elasticity (coating); by bonding the substrate with a film formed from the material for forming the organic rubber-like elastic layer or with a multilayer film comprising one or more heat-expandable pressure-sensitive adhesive layers, and a layer comprising the material for the organic rubber-like elastic layer arranged thereon (dry lamination); or by coextruding a resin substrate, with a resin composition comprising the material for the organic rubber-like elastic layer (co-extrusion).

The organic rubber-like elastic layer may comprise a pressure-sensitive adhesive substance mainly containing a natural rubber, a synthetic rubber, or a synthetic resin showing rubber elasticity or may be formed from a foamed film mainly containing the component. The foaming herein can be carried out according to a conventional procedure, such as mechanical stirring; using a gas produced as a result of reaction; using a foaming agent; removing soluble matters; spraying; forming a syntactic foam; or sintering.

The thickness of an intermediate layer such as the organic rubber-like elastic layer is, for example, about 5 to about 300 µm, and preferably about 20 to about 150 µm. An intermediate layer such as an organic rubber-like elastic layer having an excessively small thickness may not induce the three-dimensional structural change after heating and foaming to thereby impair the peelability. The intermediate layer such as an organic rubber-like elastic layer may comprise a single layer or multiple layers.

When a radiation curable substance is used typically in the heat-expandable pressure-sensitive adhesive layer, the intermediate layer such as an organic rubber-like elastic layer is preferably one that does not inhibit the transmission of the radiation.

(Separator)

The adhesive sheet in FIG. 1 comprises a separator (release liner) as a protecting member for the pressure-sensitive adhesive layer (surface pressure-sensitive adhesive layer) arranged on or above the heat-expandable pressure-sensitive adhesive layer. However, the separator is not always necessary. Such a separator (release liner) can be arranged as a protecting member for another pressure-sensitive adhesive layer, if arranged, than the surface pressure-sensitive adhesive layer.

The separator is peeled off when the pressure-sensitive adhesive layer protected by the separator is in use. In other words, the separator is peeled off when the pressure-sensitive adhesive layer protected by the separator is applied to the adherend.

The separator can be, for example, a conventional release paper. Specific examples of the separator include bases having a release layer of a plastic film or paper which surface is treated with a release agent such as a silicone, long-chain alkyl, fluorine, or molybdenum sulfide release agent; low-adhesive bases comprising fluorine-containing polymers such as polytetrafluoroethylenes, polychlorotrifluoroethylenes, poly(vinyl fluoride)s, poly(vinylidene fluoride)s, tetrafluoroethylene-hexafluoropropylene copolymers, and chlorofluoroethylene-vinylidene fluoride copolymers; and low-adhesive bases comprising non-polar polymers including olefinic resins such as polyethylenes and polypropylenes. The separator can also be used as a substrate for supporting the heat-expandable pressure-sensitive adhesive layer.

The separator can be formed according to a known or conventional procedure. The thickness and other parameters of the separator are not specifically limited.

(Other Layers)

The heat-peelable pressure-sensitive adhesive sheets have only to comprise a heat-expandable pressure-sensitive adhesive layer and a surface pressure-sensitive adhesive layer arranged in this order on or above at least one side of a substrate. They include, for example, (1) a heat-peelable pressure-sensitive adhesive sheet comprising a substrate, and a heat-expandable pressure-sensitive adhesive layer and a pressure-sensitive adhesive layer arranged in this order on or above one side of the substrate; (2) a heat-peelable pressure-sensitive adhesive sheet comprising a substrate, and a heat-expandable pressure-sensitive adhesive layer and a pressure-sensitive adhesive layer arranged in this order on or above both sides of the substrate; and (3) a heat-peelable pressure-sensitive adhesive sheet comprising a substrate, and a heat-expandable pressure-sensitive adhesive layer and a pressure-sensitive adhesive layer arranged in this order on or above both sides of the substrate, and a non-heat-expandable pressure-sensitive adhesive layer (a pressure-sensitive adhesive layer having no expandability upon heating) arranged on or above the other side of the substrate. When heat-expandable pressure-sensitive adhesive layers are arranged on or above both sides of the substrate, it is enough that at least one of the heat-expandable pressure-sensitive adhesive layers satisfies the above-mentioned requirements. These heat-peelable pressure-sensitive adhesive sheets may further comprise, for example, one or more intermediate layers, such as organic rubber-like elastic layers, arranged between the substrate and the heat-expandable pressure-sensitive adhesive layer.

(Non-Heat-Expandable Pressure-Sensitive Adhesive Layer)

The pressure-sensitive adhesive for constituting the non-heat-expandable pressure-sensitive adhesive layer is not specifically limited and can be any known or conventional pressure-sensitive adhesives including those exemplified as pressure-sensitive adhesives for use in the heat-expandable pressure-sensitive adhesive layer. Examples of such pressure-sensitive adhesives are rubber pressure-sensitive adhesives, acrylic pressure-sensitive adhesives, vinyl alkyl ether pressure-sensitive adhesives, silicone pressure-sensitive adhesives, polyester pressure-sensitive adhesives, polyamide pressure-sensitive adhesives, urethane pressure-sensitive adhesives, fluorine-containing pressure-sensitive adhesives, styrene-diene block copolymer pressure-sensitive adhesives, pressure-sensitive adhesives modified in creep behavior, and radiation-curable pressure-sensitive adhesives. Each of these pressure-sensitive adhesives can be used alone or in combination. The pressure-sensitive adhesive for constituting the non-heat-expandable pressure-sensitive adhesive layer may further comprise known or conventional additives such as plasticizers, fillers, surfactants, age resistors (antioxidants), and tackifiers.

The thickness of the non-heat-expandable pressure-sensitive adhesive layer can be 300 µm or less, for example, 1 to 300 µm, and preferably 5 to 100 µm. The non-heat-expandable pressure-sensitive adhesive layer can be formed by the same procedure as with the heat-expandable pressure-sensitive adhesive layer and the surface pressure-sensitive adhesive layer, for example, by applying a material mixture to the substrate or by applying the mixture to a separator to form a pressure-sensitive adhesive layer and transferring the formed layer to the substrate. The non-heat-expandable pressure-sensitive adhesive layer may comprise a single layer or multiple layers.

The heat-peelable pressure-sensitive adhesive sheets according to the present invention may be double-sided adhesive sheets having two adhesive surfaces but are preferably one-sided adhesive sheets having an adhesive surface on one side. Accordingly, the heat-peelable pressure-sensitive adhesive sheets are preferably those comprising a substrate, and a heat-expandable pressure-sensitive adhesive layer and a surface pressure-sensitive adhesive layer arranged in this order on one side of the substrate.

The heat-peelable pressure-sensitive adhesive sheet may be wound and formed into a roll or may constitute a multi-layer sheet comprising plural plies of sheets. The heat-peelable pressure-sensitive adhesive sheet, if wound into a roll, can be prepared typically in the following manner. The sheet can be wound into a roll in such a condition that the pressure-sensitive adhesive layer (surface pressure-sensitive adhesive layer) arranged on or above the heat-expandable pressure-sensitive adhesive layer is protected by a separator. Namely, the heat-peelable pressure-sensitive adhesive sheet to be wound as a roll can comprise a substrate, a heat-expandable pressure-sensitive adhesive layer arranged on or above one side of the substrate, a pressure-sensitive adhesive layer arranged on or above the heat-expandable pressure-sensitive adhesive layer, a separator arranged on or above the pressure-sensitive adhesive layer, and, if necessary, an intermediate layer, such as an organic rubber-like elastic layer, arranged between the substrate and the heat-expandable pressure-sensitive adhesive layer.

Such a heat-peelable pressure-sensitive adhesive sheet wound as a roll may comprise a substrate, a heat-expandable pressure-sensitive adhesive layer, and a surface pressure-sensitive adhesive layer arranged on or above one side of the substrate, and a strippable layer (back-treated layer) arranged on the other side of the substrate.

The heat-peelable pressure-sensitive adhesive sheets can be shaped into, for example, sheets or tapes.

The heat-peelable pressure-sensitive adhesive sheets according to the present invention have the above-mentioned configuration. Specifically, they comprise a heat-expandable pressure-sensitive adhesive layer having a shear modulus (in an unfoamed state; 23° C.) of $7 \times 10^6$ Pa or more, and a pressure-sensitive adhesive layer being arranged on or above the heat-expandable pressure-sensitive adhesive layer and having a shear modulus (in an unfoamed state; 23° C.) of less than $7 \times 10^6$ Pa. Accordingly, they can easily adhere to an adherend even at ordinary temperature (23° C.) upon processing of the adherend. They can prevent deformation of the heat-expandable pressure-sensitive adhesive layer due to pressurization in a pressing process upon processing of an adherend including the pressing process in the production of electronic components. They can exhibit excellent tackiness and can be easily peeled off from the processed article after processing typically in the laminating and cutting processes in the production of electronic components, and in the grinding and cutting processes in the production of semiconductor components. Accordingly, they can exhibit suitable viscoelastic force and adhesive strength for fixing the adherend upon processing, and they can have reduced tackiness as a result of heating and can therefore be easily peeled off or separated from the adherend when the adhesion should be released after achieving the target adhesion. Thus, the heat-peelable pressure-sensitive adhesive sheets according to the present invention can be advantageously used as heat-peelable pressure-sensitive adhesive sheets in processes for processing an adherend, including the pressing process in the production of electronic components; the grinding and cutting processes in the production of semiconductor components; and the laminating and cutting processes in the production of electronic components. The heat-peelable pressure-sensitive adhesive sheets can also be adherend upon conveying.

[Method of Processing an Adherend]

In the method of processing an adherend (work) according to the present invention, the adherend is processed by applying the adherend to the pressure-sensitive adhesive layer arranged on or above the heat-expandable pressure-sensitive adhesive layer of the heat-peelable pressure-sensitive adhesive sheet, and then subjecting the adherend to processing. The process in processing of the adherend can be arbitrarily selected and may include a pressing process (pressing under pressure), a laminating process, and a cutting process in the production of electronic components, and a grinding process and a cutting process in the production of semiconductor components. More specifically, processes upon processing of the adherend include the processes of printing electrodes to a green sheet, such as a patterning process; laminating process; pressing process (pressing under pressure); cutting processes such as a lapping process and a dicing process; grinding processes such as a back grinding process; firing process; and assembly process.

Upon such processing of an adherend, the pressing process in the production of electronic components requires the adhesive sheet to have a high shear modulus, and it is important to carry out the pressing process at room temperature (about 20° C. to about 25° C.) or at temperatures around room temperature (about 0° C. to about 60° C.).

In contrast, the laminating and cutting processes in the production of electronic components and the grinding and cutting processes in the production of semiconductor components, for example, require the adhesive sheet to have a high tackiness and to have a low shear modulus, and thereby the laminating and cutting processes, grinding and cutting processes should be carried out after heating the adhesive sheet. It should be noted that the temperature in heating herein must be a temperature lower than the foam initiating temperature of the foaming agent in the heat-expandable pressure-sensitive adhesive layer. The heating temperature herein is not specifically limited, as long as it is equal to or higher than room temperature and lower than the foam initiating temperature of the foaming agent in the heat-expandable pressure-sensitive adhesive layer. It is preferably set within the range of, for example, about 50° C. to about 150° C., preferably about 80° C. to about 120° C., and more preferably about 90° C. to about 110° C. After once heating the adhesive sheet, the processing such as laminating/cutting or grinding/cutting can be carried out while maintaining the work at the heating temperature or carried out after cooling the work. Namely, the processing such as laminating/cutting or grinding/cutting can be carried out at temperatures equal to or lower than the heating temperature. For example, it can be carried out at temperatures from room temperature to the heating temperature. More specifically, the processing such as laminating, cutting, grinding, and cutting can be carried out at room temperature after once cooling the heated article to room temperature, carried out while keeping the article at the heating temperature without cooling, or carried out at temperatures higher than room temperature after cooling the heated article.

When the processing processes include the laminating and cutting processes, or grinding and cutting processes, the heat-expandable pressure-sensitive adhesive layer preferably has a shear modulus (in an unfoamed state; 80° C.) of less than $7 \times 10^6$ Pa, and particularly preferably has a shear modulus (in an unfoamed state; 95° C.) of less than $7 \times 10^6$ Pa.

As is described above, the conditions such as temperature can be appropriately adjusted according to the requirements in properties such as elasticity and tackiness upon processing, in the method of processing an adherend according to the present invention.

After processing the adherend, particularly after achieving the target adhesion or when the adhesion should be released, the processed adherend can be peeled off or separated from the adhesive sheet to isolate the processed adherend (processed article) by heating to temperatures equal to or higher than the foam initiating temperature of the foaming agent in the heat-expandable pressure-sensitive adhesive layer and thereby reducing the tackiness of the pressure-sensitive adhesive layer arranged on or above the heat-expandable pressure-sensitive adhesive layer.

The heat treatment for peeling or separating the processed adherend (processed article) can be carried out using a suitable heating device or procedure, such as a hot plate, a hot air dryer, a near-infrared lamp, or an air dryer. The heating temperature has only to be a temperature equal to or higher than the thermal expansion starting temperature (foam initiating temperature) of the foaming agent, such as heat-expandable microspheres, in the heat-expandable pressure-sensitive adhesive layer. The conditions of the heat treatment can be appropriately set according typically to the surface condition of the adherend, the degree of reduction in adhesion area due typically to the type of the foaming agent such as heat-expandable microspheres, the thermal stabilities of the substrate and adherend, and heating procedure such as thermal capacity and heating device. The heat treatment can be generally carried out at temperatures of 100° C. to 250° C. for 1 to 90 seconds typically using a hot plate, or for 5 to 15 minutes typically using a hot air dryer. The heat treatment can be carried out in an appropriate stage according to the purpose of use. The heat source may also be an infrared lamp or heated water.

[Adherend]

The article (adherend; work) to be held by the heat-peelable pressure-sensitive adhesive sheet can be freely selected. Specifically, examples of the adherend are various articles including articles to be electronic components, such as silicon wafers and other semiconductor wafers, and semiconductor chips; articles to be semiconductor components, such as silicon wafers; electric articles such as ceramic capacitors and resonators; display devices such as liquid crystal cells; as well as thermal heads, solar cells, printed boards such as multilayer ceramic sheets, and "green sheets". Each of such adherends can be used alone or in combination.

[Processed Adherend; Processed Article]

Various processed articles (processed adherends) can be obtained according to the present invention, by applying the heat-peelable pressure-sensitive adhesive sheet to an For example, an article to be an electronic component, such as a semiconductor wafer, as an adherend (work) can yield, for example, an electronic component or a circuit board as a processed article. Likewise, an article to be a semiconductor component, such as a silicon wafer, as an adhered can yield a semiconductor component such as a semiconductor chip as a processed article. Specifically, electronic components and semiconductor components according to the present invention are produced by using the method of processing an adherend and using the heat-peelable pressure-sensitive adhesive sheet.

EXAMPLES

The present invention will be illustrated in further detail with reference to several Examples below, which by no means limit the scope of the present invention.

Example 1

A resin composition (mixture) was applied to a thickness after drying of 25 μm to a polyester film 100 μm thick as a substrate, was dried, and thereby yielded an organic rubber-like elastic layer thereon. The resin composition comprises 100 parts by weight of an acrylic copolymer (an acrylic copolymer comprising 100 parts by weight of butyl acrylate, 15 parts by weight of acrylonitrile, and 5 parts by weight of acrylic acid as monomer components), 3 parts by weight of an isocyanate crosslinking agent (the product of Nippon Polyurethane Industry Co., Ltd. under the trade name of "Collonate L"), and toluene as a solvent.

Next, a heat-expandable pressure-sensitive adhesive layer was formed by applying a film of a resin composition (mixture) to a thickness after drying of 40 μm to a separator, and drying the applied film. The resin composition comprises 100 parts by weight of a maleic acid-modified styrene-ethylene-butylene-styrene block copolymer [SEBS; having a weight ratio of styrene block to ethylene-butylene block of 30/70, and an acid value of 10 (mg-CH$_3$ONa/g)], 3 parts by weight of an epoxy crosslinking agent (the product of Mitsubishi Gas Chemical Company, Inc. under the trade name of "TETRAD-C"), 50 parts by weight of heat-expandable microspheres (the product of Matsumoto Yushi-Seiyaku Co., Ltd. under the trade name of "Matsumoto Microsphere F50D"; having a foam initiating temperature of 120° C. and an average particle diameter of 14 μm), and toluene as a solvent.

The heat-expandable pressure-sensitive adhesive layer on the separator was adhered to the organic rubber-like elastic layer on the polyester film so as to be in contact with each other, and thereby yielded a pressure-sensitive adhesive sheet having a layer configuration of "substrate/(organic rubber-like elastic layer)/(heat-expandable pressure-sensitive adhesive layer)/separator".

Next, after peeling off the separator, a pressure-sensitive adhesive layer (surface pressure-sensitive adhesive layer) was formed on the pressure-sensitive adhesive sheet by applying a film of a resin composition (mixture) to a thickness after drying of 0.5 μm to the heat-expandable pressure-sensitive adhesive layer using a gravure coater, and drying the resulting film. The resin composition comprises 100 parts by weight of an acrylic copolymer (an acrylic copolymer comprising 100 parts by weight of ethyl acrylate, 40 parts by weight of 2-ethylhexyl acrylate, and 5 parts by weight of 2-hydroxyethyl acrylate as monomer components), 1.5 parts by weight of an isocyanate crosslinking agent (the product of Nippon Polyurethane Industry Co., Ltd. under the trade name of "Collonate L"), and toluene as a solvent. Thereafter, a separator was placed on the pressure-sensitive adhesive layer, and thereby yielded a heat-peelable pressure-sensitive adhesive sheet having a layer configuration of "substrate/(organic rubber-like elastic layer)/(heat-expandable pressure-sensitive adhesive layer)/(pressure-sensitive adhesive layer)/separator".

Example 2

A resin composition (mixture) was applied to a thickness after drying of 15 μm to a polyester film as a substrate 50 μm thick, was dried, and thereby yielded an organic rubber-like elastic layer thereon. The resin composition comprises 100 parts by weight of an acrylic copolymer (an acrylic copolymer comprising 50 parts by weight of 2-ethylhexyl acrylate, 50 parts by weight of ethyl acrylate, and 5 parts by weight of 2-hydroxyethyl acrylate as monomer components), 3 parts by weight of an isocyanate crosslinking agent (the product of Nippon Polyurethane Industry Co., Ltd. under the trade name of "Collonate L"), and toluene as a solvent.

Next, a heat-expandable pressure-sensitive adhesive layer was formed by applying a film of a resin composition (mixture) to a thickness after drying of 40 μm to a separator, and drying the resulting film. The resin composition comprises 100 parts by weight of a maleic acid-modified styrene-ethylene-butylene-styrene block copolymer [SEBS; having a weight ratio of styrene block to ethylene-butylene block of 30/70, and an acid value of 10 (mg-CH$_3$ONa/g)], 1.5 parts by weight of an epoxy crosslinking agent (the product of Mitsubishi Gas Chemical Company, Inc. under the trade name of "TETRAD-C"), 40 parts by weight of heat-expandable microspheres (the product of Matsumoto Yushi-Seiyaku Co., Ltd. under the trade name of "Matsumoto Microsphere F50D"; having a foam initiating temperature of 120° C. and an average particle diameter of 14 μm), 30 parts by weight of a terpene phenolic resin (the product of Yasuhara Chemical Co., Ltd. under the trade name of "YS Polyster T130"), and toluene as a solvent.

The heat-expandable pressure-sensitive adhesive layer on the separator was adhered to the organic rubber-like elastic layer on the polyester film so as to be in contact with each other, and thereby yielded a pressure-sensitive adhesive sheet having a layer configuration of "substrate/(organic rubber-like elastic layer)/(heat-expandable pressure-sensitive adhesive layer)/separator".

Next, after peeling off the separator, a pressure-sensitive adhesive layer (surface pressure-sensitive adhesive layer) was formed on the pressure-sensitive adhesive sheet by applying a film of a resin composition (mixture) to a thickness after drying of 2 μm to the heat-expandable pressure-sensitive adhesive layer using a gravure coater, and drying the resulting film. The resin composition comprises 100 parts by weight of an acrylic copolymer (an acrylic copolymer comprising 50 parts by weight of 2-ethylhexyl acrylate, 50 parts by weight of ethyl acrylate, and 5 parts by weight of 2-hydroxyethyl acrylate as monomer components), 3 parts by weight of an isocyanate crosslinking agent (the product of Nippon Polyurethane Industry Co., Ltd. under the trade name of "Collonate L"), and toluene as a solvent. Next, a separator was placed on the pressure-sensitive adhesive layer and thereby yielded a heat-peelable pressure-sensitive adhesive sheet having a layer configuration of "substrate/(organic rubber-like elastic layer)/(heat-expandable pressure-sensitive adhesive layer)/(pressure-sensitive adhesive layer)/separator".

Comparative Example 1

A resin composition (mixture) was applied to a thickness after drying of 25 μm to a polyester film 100 μm thick as a substrate, was dried, and thereby yielded an organic rubber-like elastic layer thereon. The resin composition comprises 100 parts by weight of an acrylic copolymer (an acrylic copolymer comprising 100 parts by weight of butyl acrylate, 15 parts by weight of acrylonitrile, and 5 parts by weight of acrylic acid as monomer components), 3 parts by weight of an isocyanate crosslinking agent (the product of Nippon Polyurethane Industry Co., Ltd. under the trade name of "Collonate L"), and toluene as a solvent.

Next, a heat-expandable pressure-sensitive adhesive layer was formed by applying a film of a resin composition (mixture) to a thickness after drying of 40 μm to a separator, and drying the applied film. The resin composition comprises 100 parts by weight of a maleic acid-modified styrene-ethylene-butylene-styrene block copolymer [SEBS; having a weight ratio of styrene to ethylene-butylene block of 30/70, and an acid value of 10 (mg-CH$_3$ONa/g)], 3 parts by weight of an epoxy crosslinking agent (the product of Mitsubishi Gas Chemical Company, Inc. under the trade name of "TETRAD-C"), 50 parts by weight of heat-expandable microspheres (the product of Matsumoto Yushi-Seiyaku Co., Ltd. under the trade name of "Matsumoto Microsphere F50D"; having a foam initiating temperature of 120° C. and an average particle diameter of 14 μm), and toluene as a solvent.

The heat-expandable pressure-sensitive adhesive layer on the separator was adhered to the organic rubber-like elastic layer on the polyester film so as to be in contact with each other and thereby yielded a heat-peelable pressure-sensitive adhesive sheet having a layer configuration of "substrate/ (organic rubber-like elastic layer)/(heat-expandable pressure-sensitive adhesive layer)/separator".

Namely, the heat-peelable pressure-sensitive adhesive sheet according to Comparative Example 1 corresponds to the heat-peelable pressure-sensitive adhesive sheet according to Example 1, except for not forming the pressure-sensitive adhesive layer (surface pressure-sensitive adhesive layer; having a thickness of 0.5 μm).

Comparative Example 2

A resin composition (mixture) was applied to a thickness after drying of 15 μm to a polyester film as a substrate 50 μm thick, was dried, and thereby yielded an organic rubber-like elastic layer. The resin composition comprises 100 parts by weight of an acrylic copolymer (an acrylic copolymer comprising 50 parts by weight of 2-ethylhexyl acrylate, 50 parts by weight of ethyl acrylate, and 5 parts by weight of 2-hydroxyethyl acrylate as monomer components), 3 parts by weight of an isocyanate crosslinking agent (the product of Nippon Polyurethane Industry Co., Ltd. under the trade name of "Collonate L"), and toluene as a solvent.

Next, a heat-expandable pressure-sensitive adhesive layer was formed by applying a film of a resin composition (mixture) to a thickness after drying of 40 μm to a separator, and drying the resulting film. The resin composition comprises 100 parts by weight of a maleic acid-modified styrene-ethylene-butylene-styrene block copolymer [SEBS; having a weight ratio of styrene block to ethylene-butylene block of 30/70, and an acid value of 10 (mg-$CH_3ONa$/g)], 1.5 parts by weight of an epoxy crosslinking agent (the product of Mitsubishi Gas Chemical Company, Inc. under the trade name of "TETRAD-C"), 40 parts by weight of heat-expandable microspheres (the product of Matsumoto Yushi-Seiyaku Co., Ltd. under the trade name of "Matsumoto Microsphere F50D"; having a foam initiating temperature of 120° C. and an average particle diameter of 14 μm), 30 parts by weight of a terpene phenolic resin (the product of Yasuhara Chemical Co., Ltd. under the trade name of "YS Polyster T130"), and toluene as a solvent.

The heat-expandable pressure-sensitive adhesive layer on the separator was adhered to the organic rubber-like elastic layer on the polyester film so as to be in contact with each other, and thereby yielded a pressure-sensitive adhesive sheet having a layer configuration of "substrate/(organic rubber-like elastic layer)/(heat-expandable pressure-sensitive adhesive layer)/separator".

Namely, the heat-peelable pressure-sensitive adhesive sheet according to Comparative Example 2 corresponds to the heat-peelable pressure-sensitive adhesive sheet according to Example 2, except for not forming the pressure-sensitive adhesive layer (surface pressure-sensitive adhesive layer; having a thickness of 2 μm).

(Evaluations)

The heat-peelable pressure-sensitive adhesive sheets Examples 1 and 2 were evaluated on shear modulus, tackiness, peelability upon heating, and misregistration of the heat-expandable pressure-sensitive adhesive layer according to the following determination or evaluation methods. The results are shown in Table 1.

(Determination Method of Shear Modulus)

The shear modulus of the heat-expandable pressure-sensitive adhesive layer on the separator was measured before it was adhered to the organic rubber-like elastic layer on the polyester film to yield the heat-peelable pressure-sensitive adhesive sheet. More specifically, the heat-expandable pressure-sensitive adhesive layer was peeled off from the separator, the peeled heat-expandable pressure-sensitive adhesive layer was then set at a predetermined position of a dynamic viscoelasticity measuring instrument, the product of Rheometrics Inc. under the trade name of "ARES", and the shear modulus of the heat-expandable pressure-sensitive adhesive layer in an unfoamed state was determined under conditions of temperatures of 23° C., 80° C., and 95° C., a frequency of 1 Hz, a sample thickness (the thickness of the heat-expandable pressure-sensitive adhesive layer) of about 2.0 mm, and a strain of 0.1% (23° C.) or 0.3% (80° C. and 95° C.), using a jig including parallel plates having a plate diameter of 7.9 mm. The same results as in the above case at a sample thickness of about 2 mm, were obtained at a sample thickness of about 1 mm.

(Evaluation Method of Tackiness)

A sample heat-peelable pressure-sensitive adhesive sheet was cut to a width of 20 mm, from which the separator was peeled off at ordinary temperature (23° C.). Next, a poly (ethylene terephthalate) film (PET film; having a thickness of 25 μm) was applied to the surface pressure-sensitive adhesive layer or heat-expandable pressure-sensitive adhesive layer, and the 180° peel strength was measured immediately after the application (without aging) by peeling the PET film at a rate of pulling of 300 mm/min and a temperature of 23° C. In this procedure, the PET film was adhered to the pressure-sensitive adhesive layer in the samples according to Examples 1 and 2, and it was adhered to the heat-expandable pressure-sensitive adhesive layer in the samples according to Comparative Examples 1 and 2.

(Evaluation Method of Peelability Upon Heating)

A sample heat-peelable pressure-sensitive adhesive sheet was cut to a width of 20 mm, from which the separator was peeled off at ordinary temperature (23° C.). Next, a poly (ethylene terephthalate) film (PET film; having a thickness of 25 μm) was applied to the surface pressure-sensitive adhesive layer or heat-expandable pressure-sensitive adhesive layer. In this procedure, the PET film was adhered to the pressure-sensitive adhesive layer in the samples according to Examples 1 and 2, and it was adhered to the heat-expandable pressure-sensitive adhesive layer in the samples according to Comparative Examples 1 and 2. Heating was then carried out at 130° C. for one minute, and how the PET film was peeled was visually observed.

(Evaluation Method of Misregistration of Heat-Expandable Pressure-Sensitive Adhesive Layer)

Pressing at ordinary temperature (23° C.) and a pressure of 3 MPa for three seconds was conducted a total of hundred times on a sample heat-peelable pressure-sensitive adhesive sheet having a surface area of 2 $cm^2$. How far the glue (pressure-sensitive adhesive component) extruded (misregistration) was determined, and the misregistration of the heat-expandable pressure-sensitive adhesive layer was evaluated according to the following criteria. The extrusion herein was an average of maximum extrusions of the four sides.

Criteria

Good: The extrusion is 0.02 mm or less.

Poor: The extrusion exceeds 0.02 mm.

In the evaluations of the peelability upon heating and the misregistration of the heat-expandable pressure-sensitive adhesive layer, "Good" means good property, and "Poor" means poor property.

TABLE 1

|  | Shear modulus (Pa) | | | Tackiness | Peelability | Misregistration of heat-expandable |
|---|---|---|---|---|---|---|
|  | 23° C. | 80° C. | 95° C. | (N/20-mm) | upon heating | adhesive layer |
| Ex. 1 | $2.3 \times 10^7$ | $2 \times 10^6$ | $5 \times 10^5$ | 4.2 | Good | Good (0.01 mm or less) |
| Ex. 2 | $5 \times 10^7$ | $4 \times 10^6$ | $8 \times 10^5$ | 3.0 | Good | Good (0.01 mm or less) |
| Com. Ex. 1 | $2.3 \times 10^7$ | $2 \times 10^6$ | $5 \times 10^5$ | 0.1 or less | Good | Poor (0.05 mm) |
| Com. Ex. 2 | $5 \times 10^7$ | $4 \times 10^6$ | $8 \times 10^5$ | 0.1 or less | Good | Poor (0.03 mm) |

Table 1 shows that the heat-peelable pressure-sensitive adhesive sheets according to Examples 1 and 2 can be easily and firmly applied to an adherend at ordinary temperature (room temperature; 23° C.) as with regular pressure-sensitive adhesive tapes.

They have a suitable shear modulus at room temperature and a good shear modulus at 80° C. and 95° C., and, therefore, can effectively exhibit excellent elastic force and tackiness. More specifically, they show substantially no misregistration (slippage) of the heat-expandable pressure-sensitive adhesive layer even upon pressing under pressure at room temperature. Of course they can be easily peeled off from the adherend (or processed article) as a result of heating.

The heat-peelable pressure-sensitive adhesive sheets of Examples 1 and 2 according to the present invention, if used in processing of adherends, can effectively improve the component precision, enable the adherend to have a reduced size, and improve yields to thereby improve the productivity.

INDUSTRIAL APPLICABILITY

As is described above, the heat-peelable pressure-sensitive adhesive sheets according to the present invention can be used as pressure-sensitive adhesive tapes in the production of electronic components and semiconductor components. They can prevent the deformation of the pressure-sensitive adhesive layer caused by pressurization in the pressing process and can exhibit excellent tackiness and prevent the misregistration (misregistration) of the adherend in the laminating and cutting processes in the production of electronic components. They can exhibit excellent tackiness and further reduce chipping in the grinding and cutting processes in the production of semiconductor components. In addition, they can be easily peeled off from the processed article and can be easily applied to the adherend at ordinary temperature.

Consequently, the heat-peelable pressure-sensitive adhesive sheets according to the present invention, if used in processing of adherends, can effectively improve the component precision, enable the adherend to have a reduced size, and improve yields to thereby improve the productivity.

The invention claimed is:

1. A heat-peelable pressure-sensitive adhesive sheet comprising a substrate; and a heat-expandable pressure-sensitive adhesive layer arranged on or above at least one side of the substrate, the heat-expandable pressure-sensitive adhesive layer containing a foaming agent and having a shear modulus (23° C.) in an unfoamed state of $7 \times 10^6$ Pa or more, wherein the adhesive sheet further comprises a pressure-sensitive adhesive layer being arranged on or above the heat-expandable pressure-sensitive adhesive layer and having a shear modulus (23° C.) of less than $7 \times 10^6$ Pa.

2. The heat-peelable pressure-sensitive adhesive sheet according to claim 1, wherein the heat-expandable pressure-sensitive adhesive layer comprises a pressure-sensitive adhesive having a shear modulus (23° C.) after being cured or dried of $7 \times 10^6$ Pa or more, and wherein the pressure-sensitive adhesive layer arranged on or above the heat-expandable pressure-sensitive adhesive layer comprises a pressure-sensitive adhesive having a shear modulus (23° C.) after being cured or dried of less than $7 \times 10^6$ Pa.

3. The heat-peelable pressure-sensitive adhesive sheet according to one of claims 1 and 2, wherein the pressure-sensitive adhesive layer arranged on or above the heat-expandable pressure-sensitive adhesive layer has a thickness of 0.01 to 10 μm.

4. The heat-peelable pressure-sensitive adhesive sheet according to claim 1, further comprising an organic rubber-like elastic layer arranged between the substrate and the heat-expandable pressure-sensitive adhesive layer.

5. The heat-peelable pressure-sensitive adhesive sheet according to claim 1, wherein the heat-expandable pressure-sensitive adhesive layer has a shear modulus (95° C.) in an unfoamed state of less than $7 \times 10^6$ Pa.

6. The heat-peelable pressure-sensitive adhesive sheet according to claim 1, wherein the foaming agent in the heat-expandable pressure-sensitive adhesive layer has a foam initiating temperature higher than 80° C.

7. A method of processing an adherend, comprising the steps of applying the heat-peelable pressure-sensitive adhesive sheet according to claim 1 to the adherend, and subjecting the adherend to processing.

8. The method of processing an adherend according to claim 7, wherein the adherend is an article to be an electronic component.

9. The method of processing an adherend according to claim 7, wherein the adherend is an article to be a semiconductor component.

10. An electronic component produced using the method of processing an adherend according to claim 8.

11. A semiconductor component produced using the method of processing an adherend according to claim 9.

* * * * *